US008728859B2

(12) United States Patent
Breitwisch et al.

(10) Patent No.: US 8,728,859 B2
(45) Date of Patent: May 20, 2014

(54) SMALL FOOTPRINT PHASE CHANGE MEMORY CELL

(75) Inventors: Matthew J. Breitwisch, Essex Junction, VT (US); Eric A. Joseph, White Plains, NY (US); Chung H. Lam, Peekskill, NY (US); Hsiang-Lan Lung, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 12/855,079

(22) Filed: Aug. 12, 2010

(65) Prior Publication Data

US 2012/0037877 A1 Feb. 16, 2012

(51) Int. Cl.
*H01L 21/00* (2006.01)
*H01L 45/00* (2006.01)

(52) U.S. Cl.
CPC ............ *H01L 45/06* (2013.01); *H01L 45/1691* (2013.01); *H01L 45/1675* (2013.01)
USPC .............................. 438/102; 438/84; 438/139

(58) Field of Classification Search
CPC .. H01L 45/06; H01L 45/1675; H01L 45/1691
USPC ............................................ 438/102, 84, 139
See application file for complete search history.

(56) References Cited

U.S. PATENT DOCUMENTS

| 5,814,527 | A | 9/1998 | Wolstenholme et al. ......... 438/5 |
| 6,294,452 | B1 | 9/2001 | Doan et al. ..................... 438/597 |
| 7,122,824 | B2 | 10/2006 | Khouri et al. ..................... 257/2 |
| 7,485,487 | B1 | 2/2009 | Breitwisch et al. ............. 438/95 |
| 7,638,359 | B2 | 12/2009 | Lung ............................... 438/102 |
| 7,642,125 | B2 * | 1/2010 | Lung et al. ..................... 438/102 |
| 7,729,161 | B2 * | 6/2010 | Lung et al. ..................... 365/163 |
| 7,745,807 | B2 * | 6/2010 | Chen et al. ......................... 257/2 |
| 7,791,057 | B2 * | 9/2010 | Lung et al. ......................... 257/2 |
| 7,879,645 | B2 * | 2/2011 | Lung et al. ..................... 438/102 |
| 7,932,507 | B2 * | 4/2011 | Chen et al. ......................... 257/2 |
| 7,935,564 | B2 * | 5/2011 | Breitwisch et al. ............. 438/84 |
| 7,978,509 | B2 * | 7/2011 | Lung et al. ..................... 365/163 |
| 8,119,528 | B2 * | 2/2012 | Schrott et al. ................. 438/689 |
| 8,138,028 | B2 * | 3/2012 | Lung et al. ..................... 438/139 |
| 8,143,612 | B2 * | 3/2012 | Lung et al. ......................... 257/5 |
| 8,178,386 | B2 * | 5/2012 | Lung et al. ..................... 438/102 |
| 2004/0053475 | A1 | 3/2004 | Sharma ........................ 438/424 |

(Continued)

FOREIGN PATENT DOCUMENTS

| CN | 101677080 A | 3/2010 | |
| DE | 102008018741 A1 | 11/2008 | ............. H01L 27/18 |
| WO | WO03/021693 A2 | 3/2003 | ............. H01L 45/00 |

OTHER PUBLICATIONS

CN office action dated Mar. 4, 2013.

*Primary Examiner* — Laura Menz
(74) *Attorney, Agent, or Firm* — Ido Tuchman; Vazken Alexanian

(57) ABSTRACT

An example embodiment disclosed is a method for fabricating a phase change memory cell. The method includes forming a non-sublithographic via within an insulating substrate. The insulating substrate is embedded on the same layer as a first metalization layer (Metal 1) of a semiconductor wafer, and includes a bottom and a sidewall. A sublithographic aperture is formed through the bottom of the non-sublithographic via and extends to a buried conductive material. The sublithographic aperture is filled with a conductive non-phase change material. Furthermore, phase change material is deposited within the non-sublithographic via.

16 Claims, 7 Drawing Sheets

(56) References Cited

U.S. PATENT DOCUMENTS

| | | |
|---|---|---|
| 2006/0125108 A1 | 6/2006 | Gutsche et al. ............... 257/774 |
| 2008/0191187 A1* | 8/2008 | Lung et al. ...................... 257/4 |
| 2009/0014704 A1* | 1/2009 | Chen et al. ...................... 257/3 |
| 2009/0034323 A1* | 2/2009 | Lung et al. .................. 365/163 |
| 2009/0072215 A1* | 3/2009 | Lung et al. ...................... 257/4 |
| 2009/0072216 A1* | 3/2009 | Lung et al. ...................... 257/4 |
| 2009/0189138 A1* | 7/2009 | Lung et al. ...................... 257/3 |
| 2009/0212272 A1* | 8/2009 | Breitwisch et al. .............. 257/3 |
| 2009/0261313 A1* | 10/2009 | Lung et al. ...................... 257/4 |
| 2009/0289242 A1 | 11/2009 | Breitwisch et al. .............. 257/2 |
| 2010/0001253 A1 | 1/2010 | Arnold et al. .................... 257/4 |
| 2010/0029042 A1 | 2/2010 | Lung ............................. 438/102 |
| 2010/0048020 A1* | 2/2010 | Schrott et al. ................. 438/692 |
| 2010/0065808 A1* | 3/2010 | Lung et al. ...................... 257/5 |
| 2010/0193763 A1* | 8/2010 | Chen et al. ...................... 257/4 |
| 2010/0195378 A1* | 8/2010 | Lung et al. .................. 365/163 |
| 2012/0193599 A1* | 8/2012 | Lung et al. ...................... 257/4 |

* cited by examiner

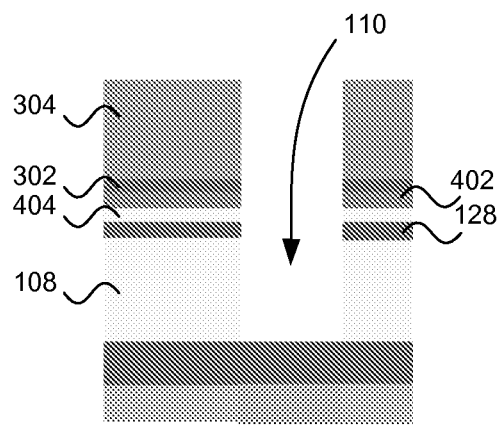
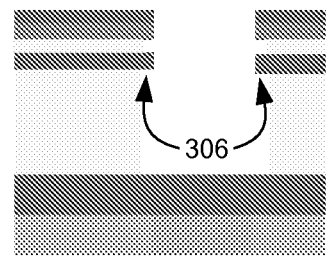
Fig. 4A    Fig. 4B
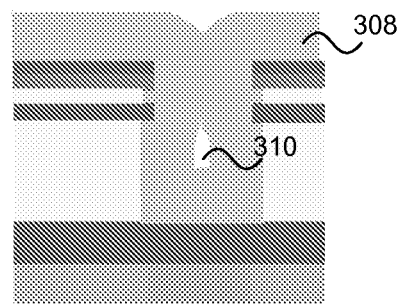
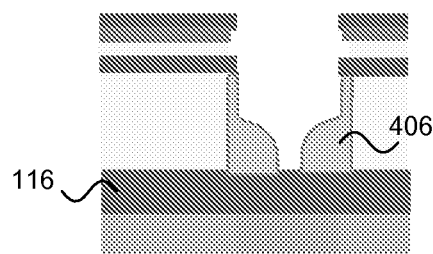
Fig. 4C    Fig. 4D
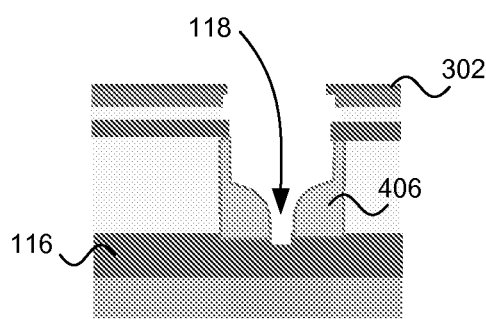
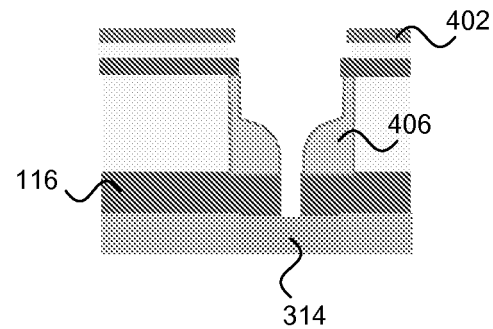
Fig. 4E    Fig. 4F

SMALL FOOTPRINT PHASE CHANGE MEMORY CELL

PARTIES TO A JOINT RESEARCH AGREEMENT

The present invention is a result of activities undertaken within the scope of a joint research agreement between International Business Machines Corporation, a New York corporation, and Macronix International Co., Ltd., a corporation of Taiwan.

BACKGROUND

The present invention is directed toward computer memory, and more particularly to a non-volatile phase change memory device.

There are two major groups of computer memory: non-volatile memory and volatile memory. Frequent input of energy to retain information is not necessary in non-volatile memory but is required in the volatile memory. Examples of non-volatile memory devices are Read Only Memory, Flash Electrical Erasable Read Only Memory, Ferroelectric Random Access Memory, Magnetic Random Access Memory, and Phase Change Memory. Examples of volatile memory devices include Dynamic Random Access Memory (DRAM) and Static Random Access Memory (SRAM). The present invention is directed to phase change memory (also known as PCM, PRAM, PCRAM, Ovonic Unified Memory, Chalcogenide RAM and C-RAM).

In phase change memory, information is stored in materials that can be manipulated into different phases. Each of these phases exhibits different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase. Furthermore, the amorphous and crystalline phases in phase change material are reversible.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

A phase change memory cell is programmed by applying a pulse of sufficient strength to alter the phase of the phase change material inside. This is typically achieved by applying an electrical pulse through the phase change material. Due to ohmic heating, the phase change material changes its phase. A relatively high intensity, short duration current pulse with a quick transition at the trailing edge results in the phase change material melting and cooling quickly. The phase change material does not have the time to form organized crystals, thereby creating an amorphous solid phase. A relatively low intensity, long duration pulse allows the phase change material to heat and slowly cool, thus crystallizing into the crystalline phase. It is possible to adjust the intensity and duration of the pulses to produce a varying degree of resistance for multi-bit storage in a memory cell.

A phase change memory cell is read by applying a pulse of insufficient strength to program, i.e. to alter the phase of, the material. The resistance of this pulse can then be read as a "1" or "0". The amorphous phase, which carries a greater resistance, is generally used to represent a binary 0. The crystalline phase, which carries a lower resistance, can be used to represent a binary 1. In cells where there are varying degrees of resistance, the phases can be used to represent, for example, "00", "01", "10", and "11".

SUMMARY

An example embodiment of the present invention is a method for fabricating a phase change memory cell. The method includes forming a non-sublithographic via within an insulating substrate. The insulating substrate is embedded on the same layer as a first metalization layer (Metal 1) of a semiconductor wafer, and includes a bottom and a sidewall. A sublithographic aperture is formed through the bottom of the non-sublithographic via and extends to a buried conductive material. The sublithographic aperture is filled with a conductive non-phase change material. Furthermore, phase change material is deposited within the non-sublithographic via.

Another example embodiment of the present invention is a phase change memory cell in a semiconductor wafer. The semiconductor wafer includes a first metalization layer (Metal 1). The phase change memory cell includes an insulating substrate defining a non-sublithographic via. The non-sublithographic via is located on the first metalization layer and includes a bottom and a sidewall. Intermediate insulating material is positioned below the insulating substrate. The intermediate insulating material defines a sublithographic aperture passing through the bottom of the non-sublithographic via. A bottom electrode is positioned within the sublithographic aperture, and is composed of conductive non-phase change material. The non-sublithographic via includes phase change material positioned within. The phase change material is electrically coupled to the bottom electrode. A liner is positioned along the sidewall of the non-sublithographic via. The liner is electrically coupled to the phase change material and is composed of the conductive non-phase change material.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to Figures.

Figure 1:
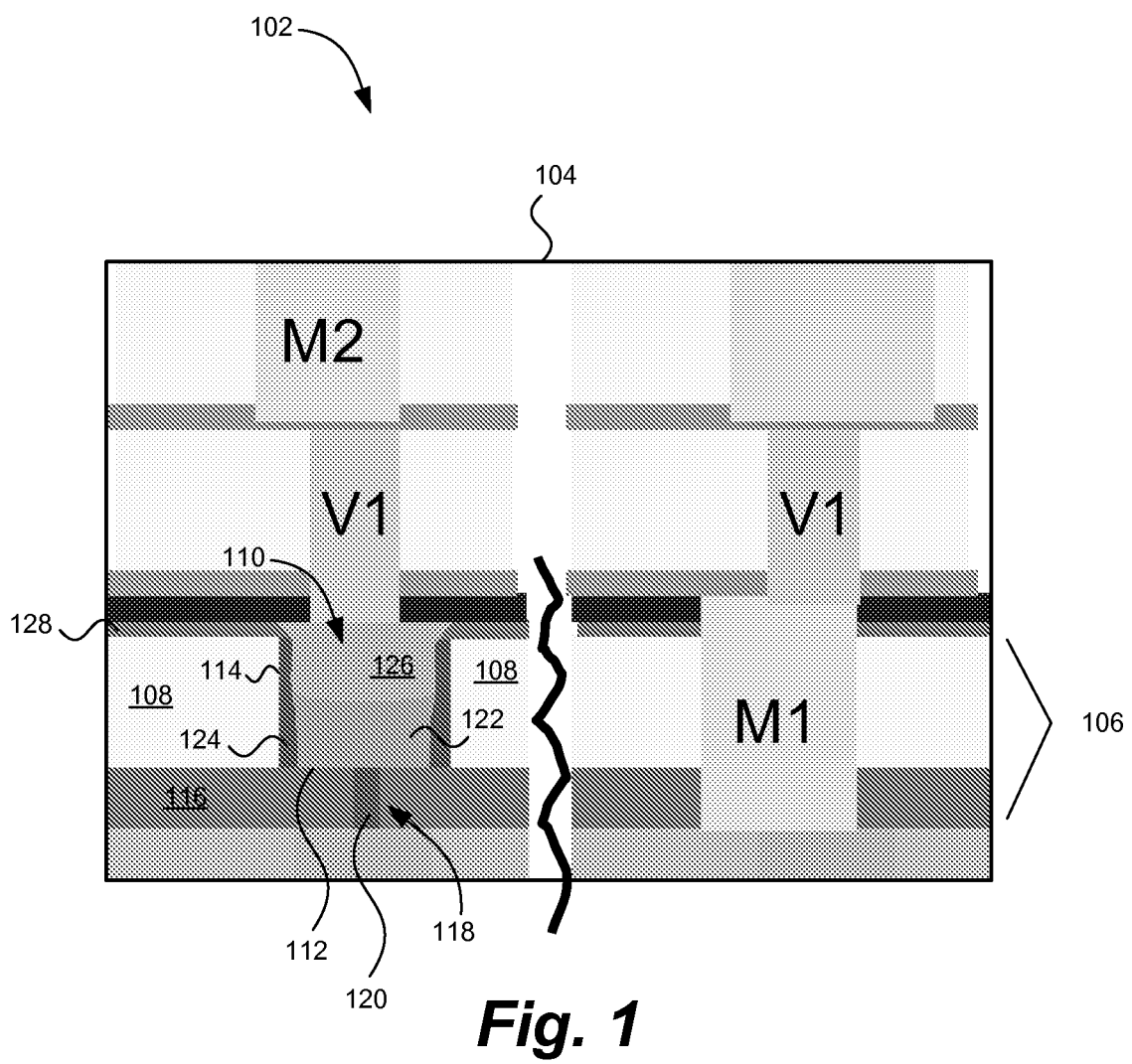
FIG. 1 shows a cross-sectional view of an example phase change memory cell contemplated by the present invention.

FIG. 1 shows a cross-sectional view of an example phase change memory cell 102 contemplated by the present invention. The memory cell 102 is fabricated on a semiconductor wafer 104 that includes a first metalization layer (Metal 1) 106.

The memory cell 102 includes an insulating substrate 108, such as silicon dioxide ($SiO_2$). Moreover, the insulating substrate 108 defines a non-sublithographic via 110. That is, the non-sublithographic via 110 is at least the width of one feature size of the lithographic technology employed to fabricate the wafer 104. The non-sublithographic via 110 is located on the first metalization layer 106 and includes a bottom 112 and a sidewall 114. The dimensions of the non-sublithographic via 110 are such that the ratio of its length to height (i.e., aspect ratio) is not greater than one.

The memory cell 102 further includes intermediate insulating material 116 positioned below the insulating substrate 108. The intermediate insulating material 116 may be composed of, for example, silicon nitrite (SiN). The intermediate insulating material 116 defines a sublithographic aperture 118 passing through the non-sublithographic via bottom 112. That is, the sublithographic aperture 118 is less than the width of one feature size of the lithographic technology employed to fabricate the wafer 104. In one embodiment, the width of the sublithographic aperture 118 is approximately one-third the lithographic feature size.

A bottom electrode 120 is positioned within the sublithographic aperture 118. The bottom electrode 120 is composed of conductive non-phase change material. As used herein, conductive non-phase change material is conductive material that is not configured to be programmable to different resistive states with application of heat. The conductive non-phase change material may be, for example, titanium nitride (TiN), tungsten (W), and tantalum nitride (TaN).

The non-sublithographic via 110 is filled, at least partially, with phase change material 122. As discussed above, the phase change material 122 may be, for example, $Ge_2Sb_2Te_5$ (GST), SbTe, and $In_2Se_3$, and is configured to be programmable to an amorphous (high resistance) state or a crystalline (low resistance) state with application of heat. Moreover, the phase change material 122 is electrically coupled to the bottom electrode 120.

A liner 124 composed of the conductive non-phase change material, such as TiN, W and TaN, is positioned along the sidewall 114 of the non-sublithographic via 110. The liner 124 is also electrically coupled to the phase change material 122 and to a top electrode 126 positioned over the phase change material 122. In addition, the top electrode 126 is electrically coupled to the phase change material 122. The memory cell 102 may include a chemical mechanical polish (CMP) stop layer 128 positioned directly above the insulating substrate 108.

Figure 2:
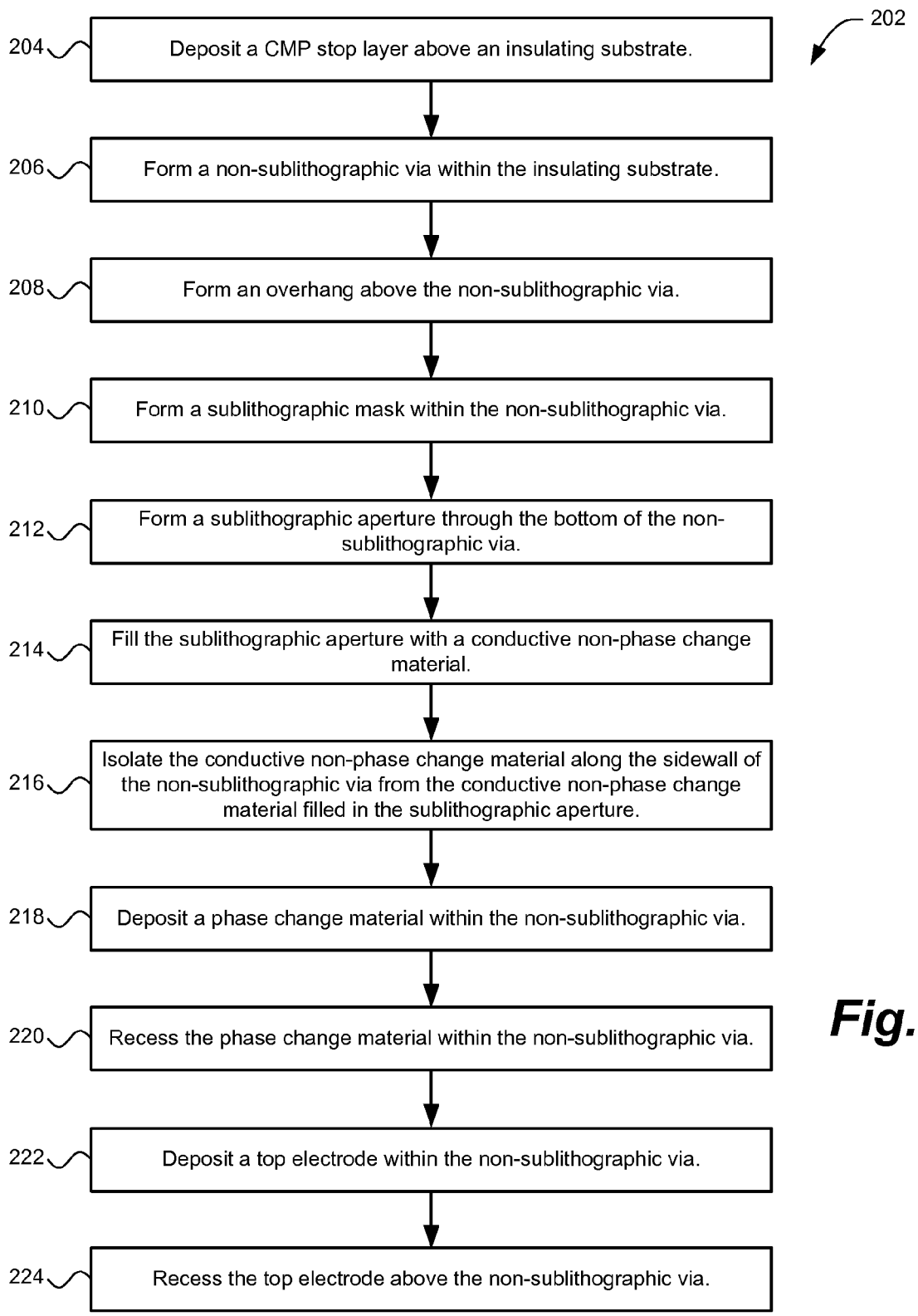
FIG. 2 shows an example flowchart for fabricating a phase change memory cell contemplated by the present invention.

FIG. 2 shows an example fabrication flowchart 202 for making a phase change memory cell contemplated by the present invention. Two example starting points for the fabrication process described are shown in FIG. 3A and FIG. 4A.

At step 204, a CMP stop layer is deposited above an insulating substrate. In FIG. 4A, the CMP stop layer 128 is shown above the insulating substrate 108. The CMP stop layer 128 may be composed of SiN. As discussed further below, the CMP stop layer 128 is configured to inhibit the chemical mechanical polish of the insulating substrate 108.

Figure 3A:
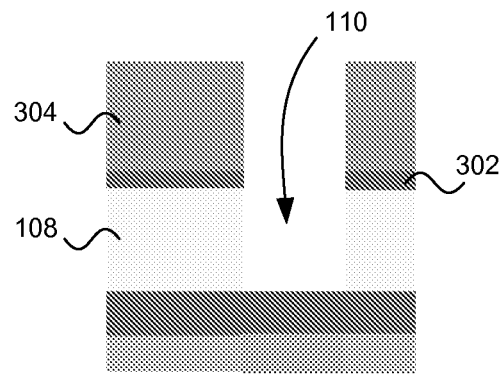
FIGS. 3A-J show cross-sectional views of the phase change memory cell during one fabrication process contemplated by one embodiment of the present invention.

The embodiment of FIG. 3A does not include the CMP stop layer. In this embodiment, a first sacrificial layer 302 of SiN is deposited over the insulating substrate 108. Turning back to FIG. 4A, the memory cell may further include a second sacrificial layer 402 of Si and a third sacrificial layer 404 of $SiO_2$.

Next, at step 206, a non-sublithographic via 110 within an insulating substrate 108 is formed. Well known lithographic technology may be used, along with a photoresist mask 304, to etch the non-sublithographic via 110. The non-sublithographic via 110 is at least one feature size in width of the lithographic technology used. As discussed above, the non-sublithographic via 110 includes a bottom and a sidewall. Furthermore, the insulating substrate 108 is embedded on the same layer as a first metalization layer (Metal 1) of a semiconductor wafer (see FIG. 1).

Figure 3B:
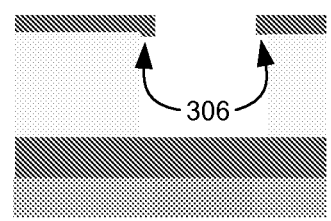

Next, at step 208, the photoresist mask 304 is removed and the non-sublithographic via 110 is undercut such that an overhang 306 is formed above the non-sublithographic via 110. FIGS. 3B and 4B show the overhang 306 formed above the non-sublithographic via 110. In one embodiment, a buffered oxide etch (BOE) is performed such that the sidewall of the non-sublithographic via is selectively etched.

Figure 3C:
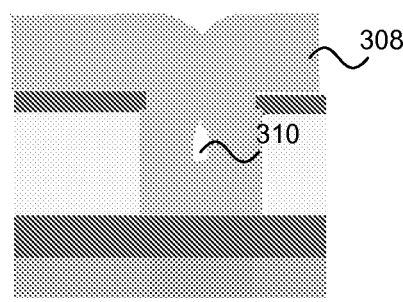

Next, at step 210, a sublithographic mask is formed within the non-sublithographic via 110. As shown in FIGS. 3C and 4C, this step may include filling the non-sublithographic via 110 with a conformal material 308 such that a keyhole cavity 310 is formed within the non-sublithographic via 110. FIG. 4D shows that the conformal material 308 is etched such that a step spacer 406 is formed by the conformal material within the non-sublithographic via 110. A chlorine based etch chemistry such as 80 sccm Ar/80 sccm $Cl_2$/2 sccm $O_2$ may be employed to selectively etch the silicon step spacer 406 with respect to a silicon nitride intermediate insulating layer 116 below.

Figure 3D:
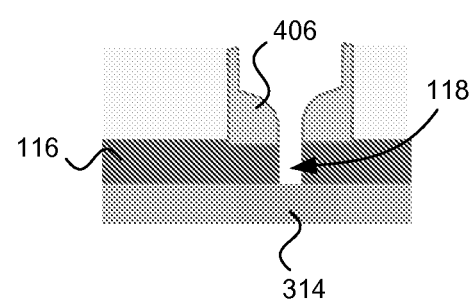

Next, at step 212, a sublithographic aperture 118 is formed through the bottom of the non-sublithographic via 110. As shown in FIG. 3D, the sublithographic aperture 118 extends through the intermediate insulating layer 116 to a buried conductive material 314. In other words, the keyhole cavity 310 in the conformal material 308 is transferred down to the intermediate insulating layer 116. In one embodiment, the sublithographic aperture 118 is approximately one-third of the feature size width of the lithographic technology used.

Turning to FIG. 4E, a low-selective breakthrough etch step is shown. The etch may consist of a low level polymerizing fluorocarbon chemistry, such as $CF_4$ or $CHF_3$. The etch removes material in the intermediate insulating layer 116 below the sublithographic aperture 118. The etch may further etch the first sacrificial layer 302 of SiN atop the larger via structures, thereby exposing the second sacrificial layer 402 (see FIG. 4F). Typical etch rate trends may be $SiO_2$>SiN>Si, but all three materials will have an appreciable etch rate.

Thus, as shown in FIGS. 3D and 4F, the intermediate insulating layer 116 is selectively etched below the step spacer 406, stopping on the buried conductive material 314. This operation may include a methyl fluoride/oxygen based selective SiN etch. The etch chemistry may be $CH_3F/O_2$. This process etches SiN highly selective to Si and with decent selectivity to $SiO_2$. Thus, the process will etch the keyhole down thru the SiN intermediate insulating layer 116 and remove any SiN remaining in the field. The silicon step spacer 406 is used as an etch mask (as the etch chemistry is so highly selective) for this process.

Figure 4G:
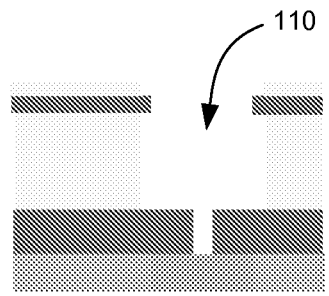
FIGS. 4A-N show cross-sectional views of the phase change memory cell during one fabrication process contemplated by another embodiment of the present invention.

In FIG. 4G, the memory cell is shown with the step spacer removed from the non-sublithographic via 110. A selective silicon etch may be used during this operation. The etch may also remove the second sacrificial layer 402.

Figure 3E:
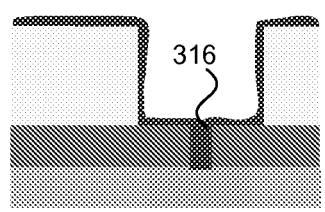
Figure 4H:
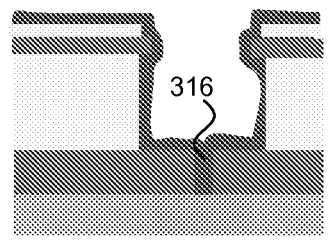

Next, at step 214, the sublithographic aperture 118 is filled with a conductive non-phase change material 316. As mentioned above, the conductive non-phase change material 316 may be, for example, TiN, W and TaN. The resulting structure is shown in FIGS. 3E and 4H. In one embodiment, filling the sublithographic aperture 118 with the conductive non-phase change material 316 includes performing a chemical vapor deposition (CVD) of the conductive non-phase change material 316 within the sublithographic aperture 118.

Figure 3F:
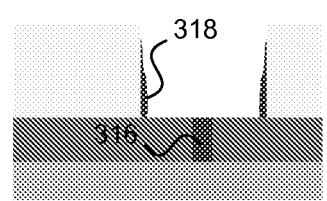
Figure 4I:
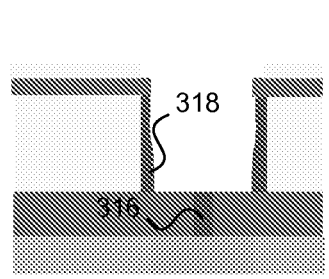

Next, at step 216 the conductive non-phase change material 318 along the sidewall of the non-sublithographic via is electrically isolated from the conductive non-phase change material 316 filled in the sublithographic aperture. As shown in FIGS. 3F and 4I, these structures may be achieved, for example, by performing a reactive ion etch (RIE) to remove the conductive non-phase change material from the bottom of the non-sublithographic via 110.

Figure 3G:
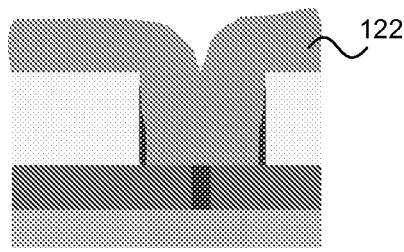
Figure 4J:
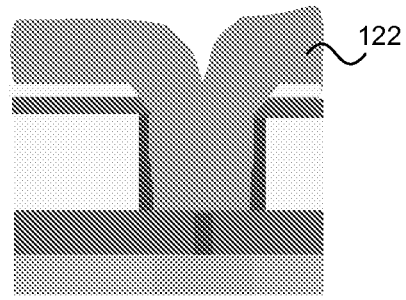

Next, at step 218, phase change material 122 is deposited within the non-sublithographic via 110. This step may include performing a physical vapor deposition (PVD) or sputter deposition of the phase change material 122, as shown in FIGS. 3G and 4J.

Since the non-sublithographic via 110 is at least one feature size in width, the process beneficially avoids a CVD or atomic layer deposition (ALD) of phase change material (or other advanced phase change material fill-in process) during the fabrication of the phase change memory cell. Moreover, the memory cell design allows for low power consumption during its operation since only a small volume of the phase change material above the bottom electrode is reset. The low power consumption, in turn, allows for smaller supporting electronic structures, such as power transistors, to be used with the memory cell. Thus, a greater density of memory cells on a single die can be achieved.

Figure 3H:
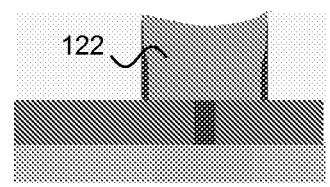
Figure 4K:
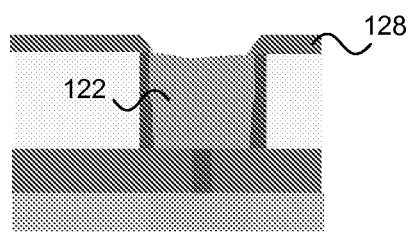
Figure 4L:
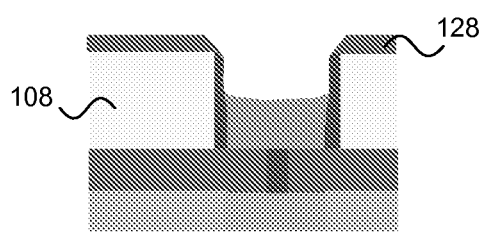

Next, at step 220, the phase change material 122 is recessed within the non-sublithographic via 110. This operation is illustrated in FIGS. 3H and 4K. In one embodiment, step 220 is performed by means of a chemical mechanical polish (CMP). In FIG. 4L, the CMP stop layer 128 is configured to inhibit the chemical mechanical polish of the insulating substrate 108. As mentioned above, the CMP stop layer 128 may be composed of SiN.

Figure 3I:
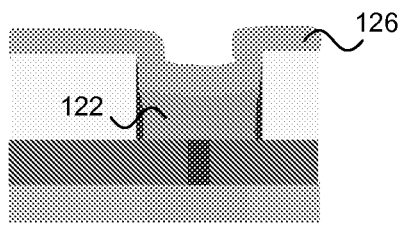
Figure 4M:
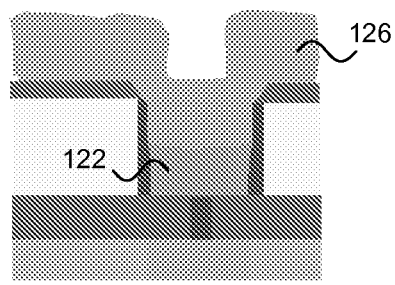

Next, at step 222, a top electrode 126 is deposited over the phase change material within the non-sublithographic via 110. In FIGS. 3I and 4M, the top electrode 126 is shown electrically coupled to the phase change material 122.

Figure 3J:
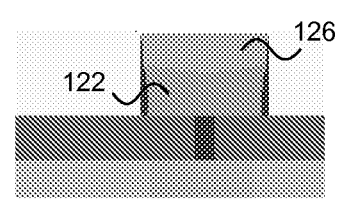
Figure 4N:
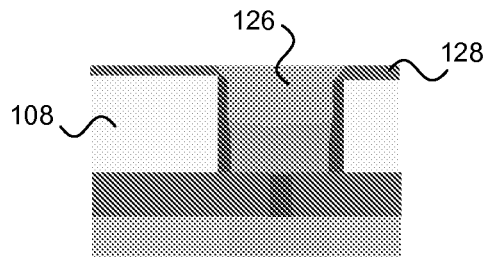

At step 224, the top electrode 126 above the non-sublithographic via 110 is recessed. In one embodiment, step 224 is performed by means of a second CMP on the top electrode 126, as shown in FIGS. 3J and 4N. In FIG. 4N, the CMP stop layer 128 is configured to inhibit the chemical mechanical polish of the insulating substrate 108.

While the preferred embodiments to the invention has been described, it will be understood that those skilled in the art, both now and in the future, may make various improvements and enhancements which fall within the scope of the claims which follow. Thus, the claims should be construed to maintain the proper protection for the invention first described.

What is claimed is:

1. A method for fabricating a phase change memory cell, the method comprising:
    forming a non-sublithographic via within an insulating substrate, the insulating substrate embedded in the same layer as a first metalization layer (Metal 1) of a multi-level metal interconnect of a semiconductor wafer, the non-sublithographic via including a bottom and a sidewall;
    forming a sublithographic aperture through the bottom of the non-sublithographic via, the sublithographic aperture extending to a buried conductive material;
    filling the sublithographic aperture with a conductive non-phase change material; and
    depositing a phase change material within the non-sublithographic via.

2. The method of clam 1, further forming an overhang above the non-sublithographic via.

3. The method of claim 2, wherein forming the overhang includes performing a buffered oxide etch such that the sidewall of the non-sublithographic via is selective etched.

4. The method of claim 1, further comprising forming a sublithographic mask within the non-sublithographic via.

5. The method of claim 4, wherein forming the sublithographic mask comprises:
    filling the non-sublithographic via with a conformal material to form a keyhole cavity within the non-sublithographic via;
    etching through the conformal material such that a step spacer is formed by the conformal material within the non-sublithographic via.

6. The method of claim 5, wherein forming the sublithographic aperture includes selectively etching an intermediate insulating layer below the step spacer.

7. The method of claim 1, wherein filling the sublithographic aperture with the conductive non-phase change material includes performing a chemical vapor deposition of the conductive non-phase change material within the sublithographic aperture.

8. The method of claim 1, further comprising electrically isolating the conductive non-phase change material along the sidewall of the non-sublithographic via from the conductive non-phase change material filled in the sublithographic aperture.

9. The method of claim 8, wherein electrically isolating the conductive non-phase change material includes performing a reactive ion etch to remove the conductive non-phase change material from the bottom of the non-sublithographic via.

10. The method of claim 1, wherein depositing the phase change material within the non-sublithographic via includes performing a physical vapor deposition of the phase change material within the non-sublithographic via.

11. The method of claim 1, further comprising recessing the phase change material within the non-sublithographic via.

12. The method of claim 11, wherein recessing the phase change material within the non-sublithographic via includes performing a chemical mechanical polish on the phase change material.

13. The method of claim 1, further depositing a top electrode over the phase change material within the non-sublithographic via.

14. The method of claim 13, further comprising recessing the top electrode above the non-sublithographic via.

15. The method of claim 14, wherein recessing the top electrode above the non-sublithographic via includes performing a chemical mechanical polish on the top conductive material.

16. The method of claim 15, further comprising depositing a CMP stop layer above the insulating substrate, the CMP stop layer configured to inhibit the chemical mechanical polish of the insulating substrate.

* * * * *